(12) United States Patent
Endo et al.

(10) Patent No.: US 9,758,860 B2
(45) Date of Patent: Sep. 12, 2017

(54) INDIUM SPUTTERING TARGET AND METHOD FOR MANUFACTURING SAME

(75) Inventors: Yousuke Endo, Kitaibaraki (JP); Masaru Sakamoto, Kitaibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 478 days.

(21) Appl. No.: 13/819,499

(22) PCT Filed: Aug. 15, 2012

(86) PCT No.: PCT/JP2012/070766
§ 371 (c)(1),
(2), (4) Date: Feb. 27, 2013

(87) PCT Pub. No.: WO2013/103029
PCT Pub. Date: Jul. 11, 2013

(65) Prior Publication Data
US 2013/0270108 A1 Oct. 17, 2013

(51) Int. Cl.
*C23C 14/00* (2006.01)
*C23C 14/34* (2006.01)
*H01J 37/34* (2006.01)

(52) U.S. Cl.
CPC ...... *C23C 14/3414* (2013.01); *H01J 37/3426* (2013.01); *H01J 37/3491* (2013.01); *H01J 37/3414* (2013.01); *H01J 37/3423* (2013.01)

(58) Field of Classification Search
CPC .............. C23C 14/3414; H01J 37/3423; H01J 37/3414
See application file for complete search history.

(56) References Cited

U.S. PATENT DOCUMENTS

| | | | |
|---|---|---|---|
| 3,046,651 A | 7/1962 | Olmon et al. | |
| 4,124,474 A | 11/1978 | Bomchil et al. | |
| 5,054,195 A | 10/1991 | Keck et al. | |
| 5,269,453 A | 12/1993 | Melton et al. | |
| 5,630,918 A | 5/1997 | Takahara et al. | |
| 6,030,514 A * | 2/2000 | Dunlop et al. | 204/298.12 |
| 6,309,556 B1 * | 10/2001 | Joyce et al. | 216/100 |
| 6,719,034 B2 | 4/2004 | Heck et al. | |
| 9,023,487 B2 | 5/2015 | Endo et al. | |
| 9,139,900 B2 | 9/2015 | Endo et al. | |
| 2003/0089482 A1 | 5/2003 | Heck et al. | |

(Continued)

FOREIGN PATENT DOCUMENTS

| | | |
|---|---|---|
| CN | 102644053 A | 8/2012 |
| DE | 10063383 C1 | 3/2002 |

(Continued)

OTHER PUBLICATIONS

Office Action mailed Feb. 26, 2015 in co-pending U.S. Appl. No. 13/504,329.

(Continued)

*Primary Examiner* — Timon Wanga
(74) *Attorney, Agent, or Firm* — Nields, Lemack & Frame, LLC

(57) ABSTRACT

An indium sputtering target with a short time to attain a stable film deposition rate once sputtering has begun is provided. An indium sputtering target having a surface to be sputtered with an arithmetic average roughness Ra of from 5 μm to 70 μm prior to sputtering.

13 Claims, 1 Drawing Sheet

(56) References Cited

U.S. PATENT DOCUMENTS

| | | | |
|---|---|---|---|
| 2005/0029675 | A1 | 2/2005 | Hua |
| 2005/0269385 | A1 | 12/2005 | Chen et al. |
| 2005/0279630 | A1 | 12/2005 | Fonte |
| 2008/0271779 | A1 | 11/2008 | Miller et al. |
| 2008/0289958 | A1* | 11/2008 | Kardokus ........... C23C 14/3414 204/298.12 |
| 2009/0057141 | A1* | 3/2009 | Tauchi et al. ............ 204/298.13 |
| 2009/0065354 | A1 | 3/2009 | Kardokus et al. |
| 2009/0250337 | A1 | 10/2009 | Simons et al. |
| 2009/0277777 | A1* | 11/2009 | Schultheis .......... C23C 14/3414 204/192.1 |
| 2010/0099214 | A1 | 4/2010 | Buquing |
| 2010/0165585 | A1 | 7/2010 | Lin et al. |
| 2011/0067997 | A1 | 3/2011 | Nguyen et al. |
| 2011/0089030 | A1 | 4/2011 | Juliano et al. |
| 2011/0155560 | A1 | 6/2011 | Kuramochi et al. |
| 2012/0213917 | A1* | 8/2012 | Simons ............... C23C 14/3414 427/74 |
| 2012/0273348 | A1 | 11/2012 | Endo et al. |
| 2013/0037408 | A1 | 2/2013 | Endo et al. |
| 2013/0105311 | A1 | 5/2013 | Maekawa et al. |
| 2013/0143069 | A1 | 6/2013 | Endo et al. |
| 2013/0153414 | A1 | 6/2013 | Endo et al. |
| 2014/0042018 | A1 | 2/2014 | Yamazaki |
| 2015/0303039 | A1 | 10/2015 | Endo et al. |
| 2016/0126072 | A1 | 5/2016 | Endo |

FOREIGN PATENT DOCUMENTS

| | | | | |
|---|---|---|---|---|
| DE | 102011012034 | A1 * | 8/2012 | ......... C23C 14/3414 |
| EP | 0500031 | A1 | 8/1992 | |
| EP | 2287356 | A1 | 2/2011 | |
| EP | 2612953 | A1 | 7/2013 | |
| JP | 57-185973 | A | 11/1982 | |
| JP | 58-145310 | A | 8/1983 | |
| JP | 63-111172 | A | 5/1988 | |
| JP | 63-44820 | B | 9/1988 | |
| JP | 3-99741 | A | 4/1991 | |
| JP | 4-301074 | A | 10/1992 | |
| JP | 5-214519 | A | 8/1993 | |
| JP | 6-287661 | A | 10/1994 | |
| JP | 8-60352 | A | 3/1996 | |
| JP | 8-218165 | A | 8/1996 | |
| JP | 8-281208 | A | 10/1996 | |
| JP | 9-25564 | A | 1/1997 | |
| JP | 10-280137 | A | 10/1998 | |
| JP | 11-236664 | A | 8/1999 | |
| JP | 2003-89869 | A | 3/2003 | |
| JP | 2003-136190 | A | 5/2003 | |
| JP | 2003-183820 | A | 7/2003 | |
| JP | 2003-533589 | A | 11/2003 | |
| JP | 2004-131747 | A | 4/2004 | |
| JP | 2005-2364 | A | 1/2005 | |
| JP | 2006-102807 | A | 4/2006 | |
| JP | 2006-322039 | A | 11/2006 | |
| JP | 2008-523251 | A | 7/2008 | |
| JP | 2009-242882 | A | 10/2009 | |
| JP | 2010-24474 | A | 2/2010 | |
| JP | 2011-236445 | A | 11/2011 | |
| JP | 4837785 | B1 | 12/2011 | |
| JP | 2012-052190 | A | 3/2012 | |
| JP | 2012-172265 | A | 9/2012 | |
| JP | 2012-251174 | A | 12/2012 | |
| TW | 1310409 | B | 6/2009 | |
| WO | 01/73156 | A2 | 10/2001 | |
| WO | 2012/029363 | A1 | 3/2012 | |
| WO | 2012/029364 | A1 | 3/2012 | |
| WO | 2012/108074 | A1 | 8/2012 | |
| WO | 2012/140928 | A1 | 10/2012 | |
| WO | 2014/030362 | A1 | 2/2014 | |

OTHER PUBLICATIONS

Office Action mailed Dec. 31, 2014 in co-pending U.S. Appl. No. 13/704,086.
Notice of Allowance mailed Feb. 9, 2015 in co-pending U.S. Appl. No. 13/808,009.
Final Rejection mailed Jan. 28, 2015 in co-pending U.S. Appl. No. 13/809,296.
International Search Report mailed Aug. 9, 2011 in co-pending PCT application No. PCT/JP2011/065585.
International Search Report mailed Aug. 9, 2011 in co-pending PCT application No. PCT/JP2011/065587.
Taiwanese Communication, with English translation, dated Aug. 27, 2012 in co-pending Taiwanese patent application No. 100127178.
International Search Report mailed Jun. 28, 2011 in co-pending PCT application No. PCT/JP2011/061682.
International Search Report mailed Aug. 28, 2012 in co-pending PCT application No. PCT/JP2012/068838.
International Search Report mailed Jun. 7, 2011 in co-pending PCT application No. PCT/JP2011/060969.
International Preliminary Report on Patentability mailed Mar. 14, 2013 in co-pending PCT application No. PCT/JP2011/061682.
International Search Report/Written Opinion dated Sep. 11, 2012 in corresponding PCT application No. PCT/JP2012/070766.
International Preliminary Report on Patentability mailed Mar. 5, 2015 in co-pending PCT application No. PCT/JP2013/052263.
Final Rejection mailed May 4, 2015 in co-pending U.S. Appl. No. 13/704,086.
Final Rejection mailed May 4, 2015 in co-pending U.S. Appl. No. 13/809,296.
Final Rejection mailed Apr. 9, 2014 in co-pending U.S. Appl. No. 13/504,329.
Final Rejection mailed Jun. 16, 2014 in co-pending U.S. Appl. No. 13/504,338.
English translation of International Preliminary Report on Patentability issued Mar. 25, 2014 in co-pending PCT application No. PCT/JP2012/068838.
Glossary of Metallurgical and Metalworking Terms, Metals Handbook, ASM Handbooks Online, ASM International, 2002, pp. 130-131, 4 pages.
A Dictionary of Chemistry, Sixth Edition, 2008, p. 283, p. 434, John Daintith, ed., 4 pages.
Office Action—Restriction—mailed May 23, 2013 in co-pending U.S. Appl. No. 13/808,009.
International Preliminary Report on Patentability mailed Feb. 28, 2013 in PCT application No. PCT/JP2011/060969.
English translation of the Written Opinion mailed Aug. 9, 2011 in co-pending PCT application No. PCT/JP2011/065585.
English translation of the International Preliminary Report on Patentability transmitted Sep. 12, 2013 in co-pending PCT application No. PCT/JP2011/065585.
English translation of the International Search Report mailed Sep. 11, 2012 in corresponding PCT application No. PCT/JP2012/070766.
English translation of the Written Opinion transmitted Jun. 7, 2013 in corresponding PCT application No. PCT/JP2012/070766.
Office Action mailed Jul. 31, 2013 in co-pending U.S. Appl. No. 13/808,009.
Office Action—Restriction—mailed Sep. 27, 2013 in co-pending U.S. Appl. No. 13/504,338.
International Preliminary Report on Patentability mailed Jul. 17, 2014 in co-pending PCT application No. PCT/JP2012/070766.
International Search Report mailed May 7, 2013 in co-pending PCT application No. PCT/JP2013/052263.
Final Rejection mailed Sep. 26, 2014 in co-pending U.S. Appl. No. 13/504,329.
Final Rejection mailed Sep. 22, 2014 in co-pending U.S. Appl. No. 13/504,338.
Office Action mailed Sep. 17, 2014 in co-pending U.S. Appl. No. 13/808,009.
Office Action mailed Sep. 26, 2014 in co-pending U.S. Appl. No. 13/809,296.
Alloy Digest, Indium Semi-Conductor Grade (data sheet), ASM International, Mar. 1998, 2 pages.

(56) References Cited

OTHER PUBLICATIONS

International Preliminary Report on Patentability mailed Oct. 31, 2013 in co-pending PCT application No. PCT/JP2011/065587.
European communication mailed Jan. 2, 2014 in co-pending European patent application No. 11821381.8.
Office Action mailed Oct. 18, 2013 in co-pending U.S. Appl. No. 13/504,329.
Office Action mailed Dec. 18, 2013 in co-pending U.S. Appl. No. 13/504,338.
Final Rejection mailed Feb. 12, 2014 in co-pending U.S. Appl. No. 13/808,009.
Notice of Allowance mailed Jun. 23, 2015 in co-pending U.S. Appl. No. 13/504,329.
Office action mailed Aug. 27, 2015 in related U.S. Appl. No. 13/809,296.
European communication dated Dec. 23, 2015 in co-pending European patent application No. 13831560.1.
International Search Report mailed Jun. 24, 2014 in co-pending PCT application No. PCT/JP2014/058987.
Office action mailed Dec. 15, 2015 in co-pending U.S. Appl. No. 13/704,086.
International Preliminary Report on Patentability issued Jan. 14, 2016 in co-pending PCT application No. PCT/JP2014/058987.
Final rejection mailed Jun. 1, 2016 in co-pending U.S. Appl. No. 13/704,086.
Office action mailed May 3, 2016 in co-pending U.S. Appl. No. 14/375,811.
Final rejection mailed Jan. 4, 2017 in co-pending U.S. Appl. No. 14/375,811.
Notice of Allowance mailed Aug. 12, 2016 in co-pending U.S. Appl. No. 13/704,086.
Office action mailed Aug. 4, 2016 in co-pending U.S. Appl. No. 14/375,811.
Co-pending U.S. Appl. No. 13/504,329, filed Apr. 26, 2012 by Endo, et al., and the Office Actions and references cited therein.
Co-pending U.S. Appl. No. 13/504,338, filed Apr. 26, 2012 by Endo, et al., and the Office Actions and references cited therein.
Co-pending U.S. Appl. No. 13/808,009, filed Jan. 2, 2013 by Endo, et al., and the Office Actions and references cited therein.
Office action dated Dec. 15, 2015 in co-pending U.S. Appl. No. 13/704,806.

* cited by examiner

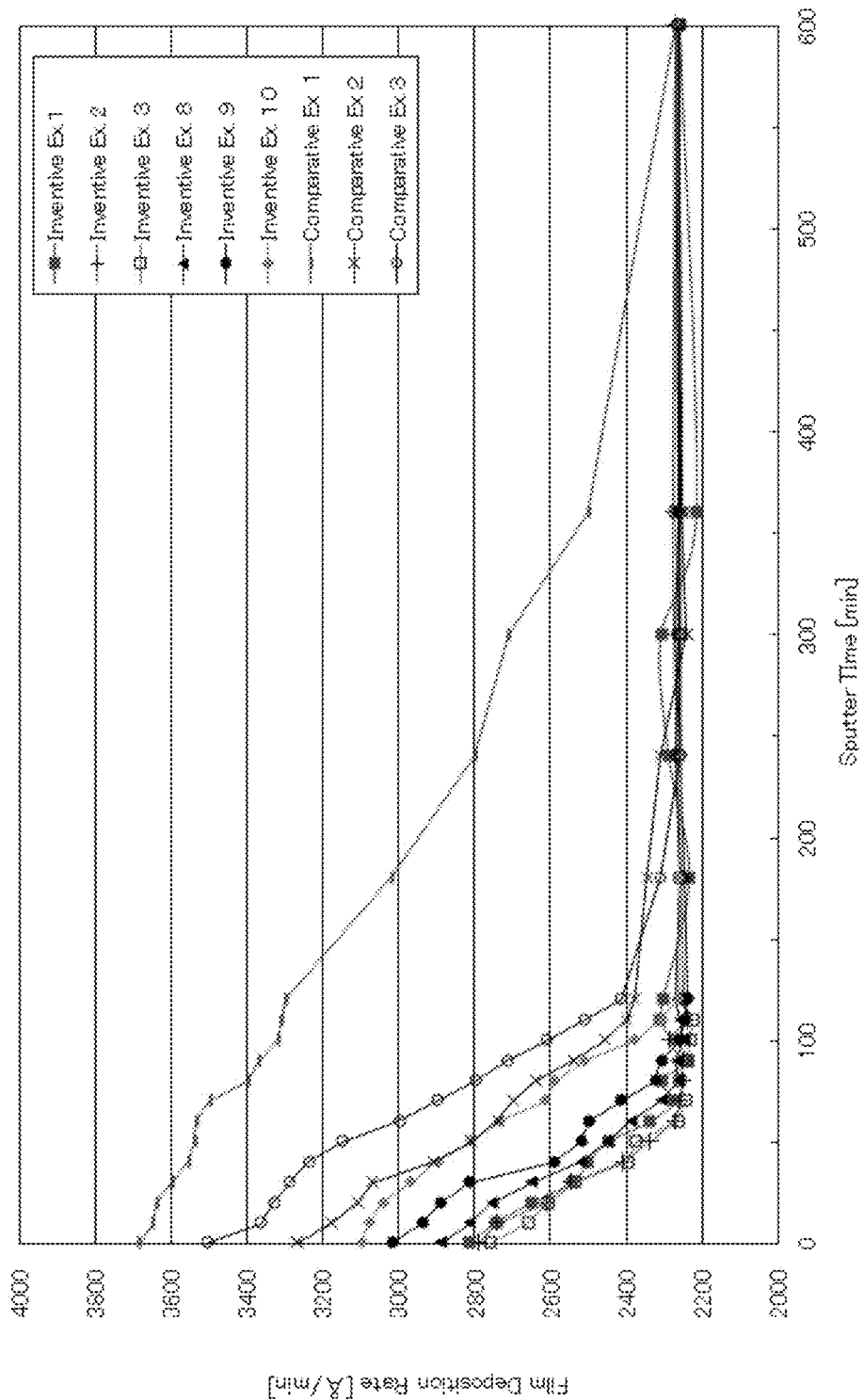

INDIUM SPUTTERING TARGET AND METHOD FOR MANUFACTURING SAME

TECHNICAL FIELD

The present invention is related to a sputtering target made of indium and a method for manufacturing the same.

BACKGROUND

Indium has been used as a sputtering target for forming a light absorbing layer for Cu—In—Ga—Se-based (CIGS-based) thin film solar cells.

Indium targets are conventionally manufactured mainly according to a melting and casting method. Japanese Examined Patent Application Publication No. 63-44820 (Patent Literature 1) describes a method of forming a thin film of indium on a backing plate, subsequently pouring indium on the thin film to cast indium, and thereby forming an indium target integrally with the backing plate. Japanese Unexamined Patent Application Publication No. 2010-24474 (Patent Literature 2) describes a method of manufacturing an indium target including the steps of feeding a predetermined amount of an indium raw material into a heated mold for melting, removing indium oxide that floats on the surface, cooling the molten indium to obtain an ingot, and grinding the surface of the ingot to obtain an indium target, wherein the predetermined amount of the indium raw material is not fed to the mold all at once but is fed in several divided portions, indium oxide formed on the molten metal surface is removed each time, and then the ingot obtained by cooling the molten metal is surface ground. Japanese Unexamined Patent Application Publication No. 2010-24474 (Patent Literature 2) also discloses that the sputtering target is manufactured via rolling process.

PRIOR ART LITERATURE

Patent Literature

[Patent literature 1] Japanese Examined Patent Application Publication 63-44820
[Patent literature 2] Japanese Unexamined Patent Application Publication 2010-024474

SUMMARY OF INVENTION

Problem the Invention is to Solve

In the conventional indium sputtering targets, there has been a problem that the control of film thickness is difficult due to the gradually lowered film deposition rate during initial sputtering, impairing the quality stabilization of sputtered film. When sputtering with indium sputtering targets, the film deposition rate is initially extremely high, but becomes gradually lower as sputtering time increases, afterward gradually stabilizing. This means that, until the film deposition rate stabilizes, film thickness fluctuates greatly over time, and variations in thickness of sputtered film is apt to occur even when sputtering is carried out for a specific period of time.

From the perspective of stable sputtered film production, a shorter amount of time needed to achieve a stable film deposition rate once sputtering has begun (stable rate attainment time) is desirable. The purpose of the present invention is thus to provide an indium sputtering target with a short stable rate attainment time along with the method of manufacture of said indium sputtering target.

Solution to Problem

The inventors considered the factors behind the dramatic drop in the initial sputtering rate, and inferred the mechanism below.

The surface of indium sputtering targets are normally formed with lathes, with further smoothing done by polishing such that surface roughness Ra is no more than 4 μm and ten point average roughness Rzjis is nor more than 60 μm. However, nodules have a greater tendency to form on a surface while sputtering when using indium, compared to other metals, causing a rough surface. With the formation of nodules, the further development of sputter-related ions and particles is hampered, dramatically reducing sputter efficiency when compared with a smooth surface, and further resulting in a tremendous decrease in the film deposition rate. However, because surface roughening is gradually progressed, it requires a great deal of time until the entire surface is covered with nodules and sputter efficiency and film deposition rate are stabilized.

The present inventors conducted research based on the above reasoning, and found that fluctuations in the sputtering rate can be controlled by roughening the surface of an indium sputtering target to an appropriate extent in advance, thus completing the present invention.

In one aspect, the present invention provides an indium sputtering target having a surface to be sputtered with an arithmetic average roughness Ra of from 5 μm to 70 μm prior to sputtering.

In one embodiment of the indium sputtering target according to the present invention, a ten point average roughness Rzjis of the surface to be sputtered is from 100 μm to 400 μm prior to sputtering.

In another embodiment of the indium sputtering target according to the present invention, a decrease in film deposition rate after ten hours is 30% or less compared with an initial film deposition rate.

In another aspect, the present invention provides a method of manufacturing the aforementioned indium sputtering target that includes a step of treating a surface to be sputtered using dry ice particle blasting.

In a further aspect, the present invention provides a method of manufacturing the aforementioned indium sputtering target that includes a step of treating a surface to be sputtered using abrasive paper having a grain size of #60 or greater.

In one embodiment of the method of manufacturing the indium sputtering target according to the invention, the abrasive paper has a grain size of from #60 to 400.

Effects of the Invention

The indium sputtering target of the present invention has a short stable rate attainment time, which will enable the stabilization of sputtered film quality.

BRIEF DESCRIPTION OF THE DRAWINGS

[Drawing 1]
This drawing shows the indium sputtering target film deposition rate over time for several inventive and comparative examples.

EMBODIMENTS OF THE INVENTION

As with targets made of other metals, conventional sputtering targets made of indium aim for decreased particles during initial sputtering, and because the surface has a low level of roughness, the level of sputtering rate decrease during initial sputtering is high, as noted above, taking a longer time to achieve a stable film deposition rate (stable rate attainment time). Thus, in our present invention the primary principle used to solve this issue is the shortening of the stable rate attainment time by bringing the film deposition rate closer to a stable zone through roughening the sputtered surface to an appropriate level, thereby decreasing the sputtering rate during initial sputtering.

Roughness Ra and Rzjis can be used as measures of surface roughness for the sputtered surface.

When using the arithmetic average roughness Ra as a measure, it is preferable that the target surface to be sputtered have the Ra of no less than 5 μm, with no less than 6 μm being more preferable, and no less than 7 μm being even more preferable. Furthermore, when using the ten point average roughness Rzjis as a measure, it is preferable that the surface to be sputtered have the Rzjis of no less than 100 μm, with no less than 120 μm being more preferable, and no less than 150 μm being even more preferable. However, surfaces that are too rough may result in occurrence of arcing. In addition, it is disadvantageous for the film deposition rate to be lower than that within the stable zone. Thus when using surface roughness Ra as a measure, it is preferable for the Ra of the target surface to be sputtered to be no more than 70 μm, with no more than 60 μm being more preferable, and no more than 50 μm being even more preferable. In addition, when using surface roughness Rzjis as a measure, it is preferable for the Rzjis of the target surface to be sputtered to be no more than 400 μm, with no more than 350 μm being more preferable, and no more than 300 μm being even more preferable.

Accordingly, in one embodiment of the indium sputtering target according to the present invention, it is preferable that the surface to be sputtered have an arithmetic average roughness Ra of from 5 μm to 70 μm, with from 6 μm to 60 μm being more preferable, and from 7 μm to 50 μm being even more preferable.

In another embodiment of the indium sputtering target according to the present invention, it is preferable that the surface to be sputtered have a ten point average roughness Rzjis of from 100 μm to 400 μm, with from 120 μm to 350 μm being more preferable, and from 150 μm to 345 μm being yet more preferable, and from 200 μm to 330 μm being even more preferable.

Surface roughness Ra and Rzjis herein used follow the definitions described in JIS B0601:2001. However, because indium is extraordinarily soft, roughness cannot be accurately measured with a stylus-type surface roughness tester due to the tester scraping away the indium itself during testing. Therefore roughness is measured with a laser microscope and other non-contact surface roughness testers.

According to the present invention, it is possible to decrease the variation between the initial film deposition rate and the film deposition rate upon entering the stable zone, and according to one embodiment of the indium sputtering targets according to the present invention, it is possible to hold the decrease in film deposition rate after ten hours have elapsed compared to the initial film deposition rate to 30% or less at a sputter power of 1.3 W/cm$^2$, preferably to 25% or less, more preferably to 20% or less, and typically from 10% to 30%. Incidentally, generally speaking, since the film deposition rate after 10 hours have elapsed is sufficiently stable, we set ten hours as the standard reference time.

Next we shall explain an example of the suitable method of manufacturing the indium sputtering target according to the present invention step by step. First, indium raw material is melted and cast into a mold. Impurities in the indium raw material will affect the conversion efficiency of solar cells made from it, so it should have high purity. For example, it has purity of 99.99 mass % or more. After casting, the indium is allowed to cool until it reaches room temperature and forms an ingot. After melting and casting, the ingot is rolled as necessary, and then subjected to shape processing and surface treatment. Rolling generally leads to a higher film deposition rate.

If a target surface can be roughened within the aforementioned range, there are no particular limitations as to the surface treatment method. However, the following methods are given for illustration.

The first method is blasting of the target surface to be sputtered using dry ice particles. While there are no limitations regarding the method of blasting, the shot blast method can be mentioned. Should the dry ice particles used be excessively large, there is a likelihood of deviation in the surface roughness according to the present invention and increased occurrence of arcing. Thus, it is preferable that dry ice pellets of 2 mm to 4 mm in diameter and 1 mm to 6 mm in length be filled in the discharge device. The diameter and length of dry ice pellets used herein are measured with calipers.

In addition, should the pressure of the compressed air during particle discharge be too high, there is a likelihood of deviation in the surface roughness of the present invention. Should the pressure be too low, the roughening will be insufficient. Thus, a setting of from 0.2 MPa to 0.6 MPa is desirable.

Should the volume of dry ice particles used in blasting be too great, there is a likelihood of deviation from the surface roughness according to the present invention. Thus, a volume of from 4 kg/h to 20 kg/h is desirable.

A second method of treatment for the target's sputtered surface uses abrasive paper. Should the grain size of the abrasive paper be too large, there is a likelihood of deviation from the surface roughness according to the present invention, while if the grain size is too small, the level of roughening may not be sufficient. In controlling the aforementioned roughness of the target surface, it is preferable to use abrasive paper having a grain size of #60 or greater, with a grain size of from #60 to 400 being more preferable, and with a grain size of from #60 to 220 being even more preferable. In the present invention, the grains size of the abrasive paper conforms to JIS R 6010. Hand finishing is preferable for surface treatment, and if a target is disk-shaped, roughening the surface by applying abrasive paper to a spinning target works well.

There are no constraints on the thickness of the target, which can be set as appropriate for the sputter device and film deposition time. However, the thickness will normally be from 3 mm to 20 mm and typically from 5 mm to 10 mm.

Indium targets obtained by this method are appropriate for use as sputtering targets for the manufacture of light-absorbing layers for CIGS thin-film solar cells.

EXAMPLES

Working examples of the present invention are shown below along with comparative examples. These examples are provided as a means to better understand the merits of the present invention, and are not intended to limit the present invention.

Indium (of purity 4N) melted at 170° C. was cast into an SUS mold of length 250 mm, width 160 mm, and depth 80 mm (all internal measurements) to a depth of 25 mm within the mold, after which it was set to cool to a room temperature of 25° C., thus producing an ingot. It was next cold rolled from a thickness of 25 mm to a total rolling reduction of 80%, creating a tile having a thickness of 5 mm that would become a target component. This tile was then cut into a polygonal shape, bonded to a copper backing plate of diameter 250 mm and thickness 5 mm, processed into a disk of diameter 204 mm and thickness 5 mm by cutting the sides with a lathe, thereby creating an indium target. In addition, some sample targets were created by casting without cold rolling. In this case, a cylindrical mold with inside diameter 210 mm and height 20 mm was placed on the backing plate into which molten metal of 170° C. was cast into it and then allowed to cool. The surface and sides were then cut with a lathe to form a disk-shaped indium target of diameter 204 mm and thickness 5 mm. Indium targets were created in this manner, and subjected to surface treatment as described in Table 1.

The specific conditions for the surface treatments described in Table 1 are as follows.

(A) Dry Ice Particle Blasting (Shot Blasting)

A-1 Device used: NIPPON EKITAN Corporation Ecoplitzer 2

Conditions of use: dry ice pellets (3 mm diameter, 3 mm length), discharge pressure 0.2 MPa, dry ice blast volume 4 kg/h A-2 Device used: NIPPON EKITAN Corporation Ecoplitzer 2

Conditions of use: dry ice pellets (3 mm diameter, 3 mm length), discharge pressure 0.4 MPa, dry ice blast volume 4 kg/h A-3 Device used: NIPPON EKITAN Corporation Ecoplitzer 2

Conditions of use: dry ice pellets (3 mm diameter, 3 mm length), discharge pressure 0.6 MPa, dry ice blast volume 4 kg/h A-4 Device used: NIPPON EKITAN Corporation Ecoplitzer 2

Conditions of use: dry ice pellets (3 mm diameter, 3 mm length), discharge pressure 0.2 MPa, dry ice blast volume 10 kg/h A-5 Device used: NIPPON EKITAN Corporation Ecoplitzer 2

Conditions of use: dry ice pellets (3 mm diameter, 3 mm length), discharge pressure 0.2 MPa, dry ice blast volume 20 kg/h A-6 Device used: NIPPON EKITAN Corporation Ecoplitzer 2

Conditions of use: dry ice pellets (3 mm diameter, 3 mm length), discharge pressure 0.6 MPa, dry ice blast volume 20 kg/h (B) Surface Roughening with Abrasive Paper A target is spun at 120 rpm in a planar direction and manually applied to an abrasive paper of the following grain sizes, generating a wheel mark.

B-1 Abrasive paper: #60
B-2 Abrasive paper: #80
B-3 Abrasive paper: #220
B-4 Abrasive paper: #400

(C) No Finish

No further finishing to rolled surface.

(D) Lathe Finish

Target surface is machined with a lathe, with a lathe mark remaining after machining.

(E) Nonwoven Fabric Finish

Target surface is rubbed with a nonwoven fabric.

(F) Abrasive Paper: #40

Target is spun at 120 rpm in a planar direction and manually applied to an abrasive paper with a grain size of #40, generating a wheel mark.

The arithmetic average roughness Ra and ten point average roughness Rzjis of the indium sputtering target's surface to be sputtered were measured in the field of 1000 µm×1418 µm using a Keyence Corporation VK-9700 model laser microscope. The results are shown in Table 1. The changes in sputter times and film deposition rates of inventive examples 1, 2, 3, 8, 9, and 10, as well as comparative examples 1, 2, and 3 are shown in FIG. 1 for reference.

Also, the indium targets of the inventive examples and the comparative examples were sputtered using an SPF-313H sputtering device manufactured by ANELVA under the conditions with an argon gas flow of 5 sccm, an in-chamber ultimate vacuum pressure of $1 \times 10^{-4}$ Pa prior to sputtering, a sputtering pressure set to 0.5 Pa and a sputter power at 430 W (1.3 W/cm$^2$). Film deposition on the substrate was done without heating the substrate, Eagle2000 (φ4 inch) manufactured by Corning. Sputtering was done in 10 minute cycles, with pre-sputtering of 1 minute, film deposition of 3 minutes, and deposition-less sputtering of 6 minutes, the same cycle then repeated. The film deposition rate was measured in 10 minute intervals up until 120 minutes elapsed since beginning sputtering, then at 60 minute intervals up until 300 minutes elapsed, and then again after 600 minutes elapsed. Sputter time is the total of deposition-less sputtering time, pre-sputter time during film deposition, and film deposition time. Results are shown in Table 1, which describes the initial film deposition rate, film deposition rate after 10 hours, film deposition rate decrease, stable rate attainment time, and the number of arcings until 10 hours of sputtering from the beginning of sputtering. The stable rate attainment time was defined as the time it took for the film deposition rate at each point of measurement to initially attain deviation of within 1% as compared to the film deposition rate after 10 hours.

The film deposition rate was derived with the following procedure. First, the thickness of film was calculated from the indium amount obtained by measuring the weight difference of a glass substrate before and after film deposition, and the substrate surface area. Then the thickness was divided by the film deposition time.

The number of arcings was measured by visual observation.

TABLE 1

| No. | Cold Rolling | Type of Surface Treatment | Ra (µm) | Rzjis (µm) | Initial Film Deposition Rate (Å/min) | Film Deposition Rate after 10 Hours (Å/min) | Film Deposition Rate Decrease (%) | Stable Rate Attainment Time (min) | Arcing Occurrences |
|---|---|---|---|---|---|---|---|---|---|
| Inventive Example 1 | Yes | A-1 | 9 | 174 | 2816 | 2260 | 19.7 | 70 | 0 |
| Inventive Example 2 | Yes | A-2 | 15 | 195 | 2791 | 2271 | 18.6 | 60 | 0 |
| Inventive Example 3 | Yes | A-3 | 17 | 215 | 2760 | 2265 | 17.9 | 60 | 0 |
| Inventive Example 4 | Yes | A-4 | 18 | 220 | 2715 | 2261 | 16.7 | 60 | 0 |

TABLE 1-continued

| No. | Cold Rolling | Type of Surface Treatment | Ra (μm) | Rzjis (μm) | Initial Film Deposition Rate (Å/min) | Film Deposition Rate after 10 Hours (Å/min) | Film Deposition Rate Decrease (%) | Stable Rate Attainment Time (min) | Arcing Occurrences |
|---|---|---|---|---|---|---|---|---|---|
| Inventive Example 5 | Yes | A-5 | 28 | 280 | 2676 | 2256 | 15.7 | 60 | 0 |
| Inventive Example 6 | Yes | A-6 | 50 | 310 | 2655 | 2260 | 14.9 | 50 | 0 |
| Inventive Example 7 | Yes | B-1 | 31 | 350 | 2719 | 2271 | 16.5 | 60 | 15 |
| Inventive Example 8 | Yes | B-2 | 21 | 344 | 2890 | 2263 | 21.7 | 80 | 0 |
| Inventive Example 9 | Yes | B-3 | 8 | 230 | 3020 | 2260 | 25.2 | 100 | 0 |
| Inventive Example 10 | Yes | B-4 | 6 | 210 | 3100 | 2264 | 27.0 | 120 | 0 |
| Inventive Example 11 | No | A-1 | 9 | 177 | 2420 | 1850 | 23.6 | 70 | 0 |
| Inventive Example 12 | No | A-5 | 29 | 281 | 2215 | 1799 | 18.8 | 60 | 0 |
| Comparative Example 1 | Yes | C | 0.6 | 30 | 3686 | 2272 | 38.4 | 600 | 0 |
| Comparative Example 2 | Yes | D | 3.5 | 85 | 3270 | 2261 | 30.9 | 300 | 0 |
| Comparative Example 3 | Yes | E | 4 | 55 | 3507 | 2269 | 35.3 | 240 | 0 |
| Comparative Example 4 | Yes | F | 75 | 510 | 2700 | 2261 | 16.3 | 50 | 260 |

The following can be ascertained from the aforementioned results.

Inventive examples 1 to 6 have surfaces roughened by dry ice particle blasting. As Ra and Rzjis increase, the film deposition rate decrease slows, and the stable rate attainment time becomes shorter.

In inventive examples 7-10, surfaces were roughened using abrasive paper, but these showed similar tendencies.

Cold rolling was not performed on examples 11-12, and the film deposition rate was lower overall than the above examples, though similar effects were confirmed. The effects of surface roughening treatment were confirmed, regardless of rolling or casting methods.

The stable rate attainment time of comparative example 1 was longer than the inventive examples because it had smooth surfaces that were not roughened after rolling.

The stable rate attainment time of comparative example 2 was longer than the inventive examples because it was finished with a lathe, rendering a smooth surface.

The stable rate attainment time of comparative example 3 was longer than the inventive examples because the target surface was smooth because it was just wiped with an unwoven fabric.

In comparative example 4, Ra and Rzjis were too large and multiple arcings occurred during sputtering though the stable rate attainment time was short.

What is claimed is:

1. An indium metal sputtering target having purity of 99.99 mass % or more and having a surface to be sputtered with an arithmetic average roughness Ra of from 5 μm to 70 μm in advance of sputtering time.

2. An indium metal sputtering target having purity of 99.99 mass % or more and having a surface to be sputtered with a ten point average roughness Rzjis of from 100 μm to 400 μm in advance of sputtering time.

3. The indium metal sputtering target according to claim 1, wherein a decrease in film deposition rate after ten hours is 30% or less compared with an initial film deposition rate.

4. A method of manufacturing an indium metal sputtering target according to claim 1, comprising a step of treating a surface to be sputtered using dry ice particle blasting.

5. A method of manufacturing an indium metal sputtering target according to claim 2, comprising a step of treating a surface to be sputtered using dry ice particle blasting.

6. A method of manufacturing an indium metal sputtering target according to claim 3, comprising a step of treating a surface to be sputtered using dry ice particle blasting.

7. The indium metal sputtering target according to claim 2, wherein a decrease in film deposition rate after ten hours is 30% or less compared with an initial film deposition rate.

8. A method of manufacturing an indium metal sputtering target according to claim 1, comprising a step of treating a surface to be sputtered using an abrasive paper having a grain size of #60 or greater.

9. A method of manufacturing an indium metal sputtering target according to claim 2, comprising a step of treating a surface to be sputtered using an abrasive paper having a grain size of #60 or greater.

10. A method of manufacturing an indium metal sputtering target according to claim 3, comprising a step of treating a surface to be sputtered using an abrasive paper having a grain size of #60 or greater.

11. A method of manufacturing an indium metal sputtering target according to claim 8, wherein the abrasive paper has a grain size of from #60 to 400.

12. A method of manufacturing an indium metal sputtering target according to claim 9, wherein the abrasive paper has a grain size of from #60 to 400.

13. A method of manufacturing an indium metal sputtering target according to claim 10, wherein the abrasive paper has a grain size of from #60 to 400.

* * * * *

UNITED STATES PATENT AND TRADEMARK OFFICE
CERTIFICATE OF CORRECTION

PATENT NO. : 9,758,860 B2  Page 1 of 1
APPLICATION NO. : 13/819499
DATED : September 12, 2017
INVENTOR(S) : Endo et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 478 days.

Signed and Sealed this
Twenty-fifth Day of September, 2018

Andrei Iancu
*Director of the United States Patent and Trademark Office*